US006300806B1

(12) United States Patent
Theus et al.

(10) Patent No.: US 6,300,806 B1
(45) Date of Patent: Oct. 9, 2001

(54) SIGNAL GENERATOR

(75) Inventors: Ulrich Theus, Gundelfingen; Reiner Bidenbach, Voerstetten, both of (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/448,049

(22) Filed: Nov. 23, 1999

(30) Foreign Application Priority Data

Nov. 23, 1998 (EP) ..................................... 98 12 2216

(51) Int. Cl.[7] ................................................ H03K 3/00

(52) U.S. Cl. ...................... 327/112; 327/170; 327/437; 326/87

(58) Field of Search ......................... 327/108–112, 170, 327/436, 437; 326/85, 87

(56) References Cited

U.S. PATENT DOCUMENTS

| | | | |
|---|---|---|---|
| 4,618,788 | 10/1986 | Backes et al. . | |
| 4,816,830 | 3/1989 | Cooper . | |
| 5,268,847 | 12/1993 | Potetz et al. . | |
| 5,811,991 * | 10/2000 | Takashima | 326/87 |
| 5,859,552 * | 1/1999 | Do et al. | 327/170 |
| 6,127,861 * | 10/2000 | Lee | 327/112 |

FOREIGN PATENT DOCUMENTS 0 116 669 A 8/1984 (EP) .

* cited by examiner

*Primary Examiner*—Kenneth B. Wells
(74) *Attorney, Agent, or Firm*—Samuels, Gauthier & Stevens, LLP

(57) ABSTRACT

A function generator includes a switching stage for forming a defined signal waveform. The switching stage includes switching transistors that are turned on in a predetermined sequence of undelayed and delayed clock signals, with an output node summing the output currents of the switching transistors. The function generator also includes a delay device that generates the undelayed and delayed clock signals from an applied clock signal. The delays of the delayed clock signals define predetermined instants within at least one period of the applied clock signal. The switching edge is divided into different time ranges whose respective edge steepnesses are adjustable independently of each other. By point-mirroring the signal waveform about a medium value of the signal edge, frequencies at twice, four times, six times, etc. the frequency of the fundamental signal frequency are reduced. Due to the sinusoidal shape of the switching edges, electromagnetic emissions are reduced because of the reduced amplitude of the harmonics. The electromagnetic emission reduction applies both to pure clock signals and to other digital signals, including control, data, or supply lines.

3 Claims, 5 Drawing Sheets

| ti | N | P | | ti | P | N | |
|---|---|---|---|---|---|---|---|
| t0 | 3N | 0 | sp0 | t15 | 3P | 0 | sp1 |
| t1 | +6N | " | | t16 | +6P | " | |
| t2 | +9N | " | | t17 | +9P | " | |
| t3 | +12N | " | | t18 | +12P | " | |
| t4–t7 | +0N | " | | t19–t22 | +0P | " | |
| t8 | +10N | " | | t23 | +10P | " | |
| t9 | +12N | " | | t24 | +12P | " | |
| t10 | +14N | " | | t25 | +14P | " | |
| t11 | +16N | " | | t26 | +16P | " | |
| t12–t14 | +0N | " | | t27–t29 | +0P | " | |

FIG. 3

| ti | t0 | t1 | t2 | t4 | t7 | t10 |
|---|---|---|---|---|---|---|
| $G3=2^3$ | 5.9/0.7 | 50 | 33.1 | 57.6 | 177.2 | — |
| $G2=2^2$ | 3.2/0.7 | 25.3 | 16.8 | 29.1 | 88.8 | — |
| $G1=2^1$ | 1.9/0.7 | 12.9 | 8.6 | 14.8 | 44.7 | — |
| $G0=2^0$ | 1.2/0.7 | 6.7 | 4.6 | 7.7 | 22.6 | — |
| Pg | 1.5/0.7 | 9.5 | 6.4 | 10.8 | 32.4 | — |
| ti | t10 | t11 | t12 | t14 | t17 | t20,t0 |
| $G3=2^3$ | 7.1/0.7 | 13.3 | 29.6 | 18.1 | 47.5 | — |
| $G2=2^2$ | 3.7/0.7 | 6.8 | 14.9 | 9.1 | 23.9 | — |
| $G1=2^1$ | 1.9/0.7 | 3.5 | 7.6 | 4.7 | 12 | — |
| $G0=2^0$ | 1.1/0.7 | 1.9 | 3.9 | 2.5 | 6.1 | — |
| Ng | 1.5/0.7 | 2.6 | 5.5 | 3.4 | 8.8 | — |
| | W/L | W | W | W | W | W |

FIG. 6

SIGNAL GENERATOR

BACKGROUND OF THE INVENTION

This invention relates to a signal function generator.

Function generators often generate interfering harmonics that are often associated with the steep signal edges of the generated signal waveform. Harmonics caused by large current changes are particularly troublesome in monolithic integrated circuits if in the presence of a relatively large capacitive load, the associated voltage level is changed within a relatively short time interval. This occurs in digital circuits which change a large number of states simultaneously and synchronously with a common clock. The associated load currents add up on the clock and supply lines and produce electromagnetic interference via these lines. If external loads are switched via output stages, the load currents also appear on the output lines of these output stages resulting in additional electromagnetic interference. The magnitude of the interference is dependent on the output stage, the load, and the kind and length of the interconnecting lines. The contribution of the lines is largely determined by the geometry and is subject to only small variations. In contrast, the contributions of the output stage and the load depend on the respective circuit technology, the manufacturing tolerance, the temperature, the number and size of the transistors, and other variables, and may therefore vary widely.

In CMOS circuits, the load includes the sum of the input capacitances of the transistor gates to be switched. Typical sum values for the input capacitances to be taken into account range between about 5 pF and several hundred pF. Even though it is not generally necessary to cover the entire range of values, it is readily apparent that conventional complementary driver circuits are not suitable for use as function generators, because in conjunction with the connected load capacitances they cause an approximately exponential charging or discharge process. A disadvantage of the resulting switching edge is that during the transition, the waveform has widely differing slopes. At the beginning, the slope is very steep, so that many harmonics are produced; at the end, the waveform rises very slowly, so that the final level is reached only very late. Eliminating both disadvantages simultaneously is not possible with prior-art complementary circuits. To hold the various tolerances for the maximum permissible transition time of the switching edge, the complementary driver circuit is designed for the worst-case tolerance combination, so that the edges at the beginning are much too steep and, thus, produce unwanted harmonics.

There are also other cases where the shape of the switching edges has to be considered, for example if on rising and falling edges of digital signals, the respective switching thresholds are to be reached at particular points of time. This is important, for example, if overlapping or nonoverlapping is required. In the case of other digital signals where only one switching edge is important, for example, only the shape and duration of this edge is of interest. The shape and duration of the second edge is insignificant for interference considerations if it is less steep than the first edge. On the other hand, there are signals whose edges are to be as trapezoidal or symmetric as possible.

The problem of radio-frequency electromagnetic emissions from signal, supply, and clock lines becomes more critical with the increasing complexity of monolithic integrated circuits, the increasing number of transistors, and increasing processing speed. Specifications relating to interference to other equipment or to internal interference are frequently found under the abbreviation EMC (electromagnetic compatibility). Internal interference may occur, for example, if in addition to digital subcircuits, analog subcircuits are present in the respective circuit and signal corruption is caused therein by spurious digital signals being superimposed on the analog signals.

Therefore, there is a need for a function generator that controls the generated waveform in the edge regions of the waveform to reduce the generation of signal noise such as harmonic frequencies.

SUMMARY OF THE INVENTION

An object of the invention to provide a monolithically integrable function generator for internal or external signals with which the signal transition and the current change associated therewith can be predetermined.

Briefly, according to the present invention, a function generator comprises a switching stage for forming a defined signal waveform. The switching stage includes switching transistors that are turned on in a predetermined sequence of undelayed and delayed clock signals, with an output node summing the output currents of said switching transistors. The function generator also includes a delay device that generates the undelayed and delayed clock signals from an applied clock signal. The delays of the delayed clock signals define predetermined instants within at least one period of the applied clock signal.

The switching edge is divided into different time ranges whose respective edge steepnesses are adjustable independently of each other. By point-mirroring the signal waveform about a medium value of the signal edge, frequencies at twice, four times, six times, etc. the frequency of the fundamental signal frequency are reduced. Due to the sinusoidal shape of the switching edges, electromagnetic emissions are reduced because of the reduced amplitude of the harmonics. The electromagnetic emission reduction applies both to pure clock signals and to other digital signals, including control, data, or supply lines (hereinafter collectively referred to as “signal”).

A fine-step adjustment of the steepness without the need for a major amount of integrated circuit area is achieved by turning weighted switching transistors on and/or off if the weighted transistors are switchable in groups. The current yield is weighted via the emitter area in the case of bipolar transistors or via the width-to-length (W/L) ratio of the respective gate region in the case of CMOS transistors. Weight grading via powers of two permits a digital selection of the group members or their control by means of binary numbers. Setting the weighting via like transistors connected in parallel is more accurate but requires a greater amount of area.

Increased flexibility of the function generator is achieved if the frequency of the clock signal is not fixed, but varies or is adjustable within limits. This is accomplished by a first control circuit that controls the delays of the delayed clock signals. The control is provided with respect to the respective reference phase and frequency of the clock signal. To provide the individual delays, the control circuit uses delay chains whose total or partial delay is locked to the respective clock signal by a phase-locked loop. A detailed example of this is described in EP 0 116 669 A assigned to the assignee of the present invention.

The embodiment that can be coupled to an arbitrary clock is advantageous if the clock is not present in the respective circuit as a fixed system clock, but is variable or not yet known. This embodiment is also suitable for use as a general module of a program library, because in the circuit design, no frequency matching is necessary within wide limits.

A further improvement in the flexibility of the function generator is achieved with a second control loop to make the current yield of the switching transistors independent of the respective load. The second control loop is preferably independent of the first control loop. The change in current yield is effected simply by switching the transistors on or off or by a different group selection. The necessary control is provided by a second control circuit, in which a voltage comparator compares an instantaneous voltage value (=actual value) with a desired value during the switching edge to form a control signal, which may also be a selection signal. With the selection signal, the weighting of the connected switching transistors is increased or decreased jointly until the deviation of the actual value from the desired value has again become small enough, with the current yield ratios being maintained. Suitable desired values are, for example, the medium levels of the positive- and negative-going switching edges. An up/down counter is controlled according to the position of the deviation. Its contents are adapted to the weighting value by control logic.

With a sinusoidal characteristic of the switching edge, the least number of harmonics is achieved in the case of clock, control, or data signals. Such an edge characteristic can be simulated to a good approximation, as an embodiment of the invention will show. If in the case of clock signals the two sinusoidal edges correspond to half a clock period, a square-wave signal has been changed into a sinusoidal signal that ideally contains no harmonics at all. A disadvantage may be the short dwell time in the upper or lower level range. These times can be increased if the edges are adjusted by the function generator to be less than half a clock period. For data signals, which as a rule comprise two or more clock periods, the sinusoidal edge duration is chosen to be longer than half a clock period. It is advisable not to go beyond one clock period, because then the additional effect with respect to radiated interference is negligible while the disadvantages increase due to the delayed data acceptance. However, stretching of the edges of data signals over a few clock periods may be appropriate in cases where the clock rate is substantially higher than the data rate.

The function generator can also be used to set relatively complicated signal waveforms that may even correspond to a frequency doubling or frequency multiplication of a clock signal. In the case of frequency doubling, a double pulse with predetermined edges is generated within a single clock period by controlling the delayed clock signal using two rising edges and two falling edges.

To form switching edges with defined rates of rise and fall, complementary switching transistors are necessary whose output currents are summed in the aforementioned output node. Such a function generator, whose complementary switching transistors are controlled by delayed clock signals, can advantageously replace a conventional driver circuit that includes a complementary pair of transistors.

These and other objects, features and advantages of the present invention will become apparent in light of the following detailed description of preferred embodiments thereof, as illustrated in the accompanying drawings.

BRIEF DESCRIPTION OF THE DRAWING

FIG. 3 illustrates, in tabular form, an example of a time-dependent weighting of n- and p-channel switching transistors with a sinusoidal edge characteristic;

FIG. 6 illustrates, in tabular form, an example of a time- and load-dependent weighting via the channel widths of n- and p-channel transistors.

DETAILED DESCRIPTION OF THE INVENTION

Figure 1:
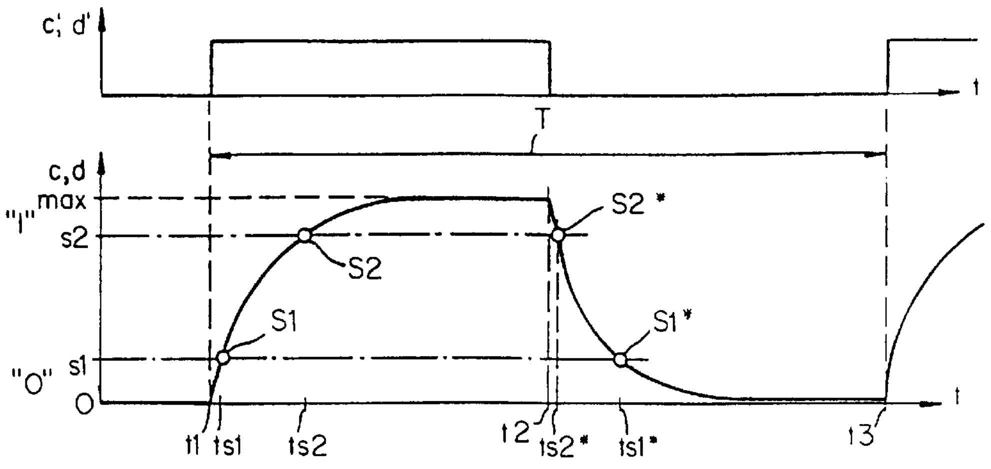
FIG. 1 is a plot of a signal as a function of time.

FIG. 1 shows in a time diagram the input waveform of a clock signal c' or data signal d' and the approximately exponential output waveform of the clock or data signal c, d, which results from the load capacitance to be driven. First and second switching thresholds s1, s2, respectively define logic state thresholds for the signals c, d. Logic 0 is below the threshold s1 and logic 1 is above the threshold s2. The positions of the thresholds s1, s2 and the associated switching instants ts1, ts2, ts2*, ts1* are important for the signal processing and for noise immunity.

FIG. 1 illustrates that with increasing clock rates and processing speeds, the duration of the level transitions is no longer negligible compared to the period T. At the instant t1, the positive-going edge begins to rise rather steeply. The first threshold s1 is exceeded at the instant t11, after which the rate of rise decreases rapidly. The second threshold s2 is exceeded at the instant ts2. The associated signal levels are S1 and S2. Finally, the signal c, d, rising at an increasingly slower rate, approaches the maximum value max. The negative-going edge begins at the instant t2. The thresholds s2 and s1 are passed at the instants ts2* and t1*, respectively; the associated signal values are s2* and s1*, respectively. At the instant t3, the next positive-going edge begins.

The steep edges at the instants ts1, ts2* produce high charging and discharge currents, respectively, because of the connected load capacitance (not shown). If these currents flow through lines, they cause radiated emissions. Such interfering lines may for instance be supply lines, short connections to other circuits, or even connections to blocking devices. In addition, the asymmetry within the switching edge causes interfering frequencies already at twice the clock or data rate. Thus, the interference to analog subcircuits is frequently close to the useful signal and can only be eliminated with a large amount of filter circuitry.

Figure 2:
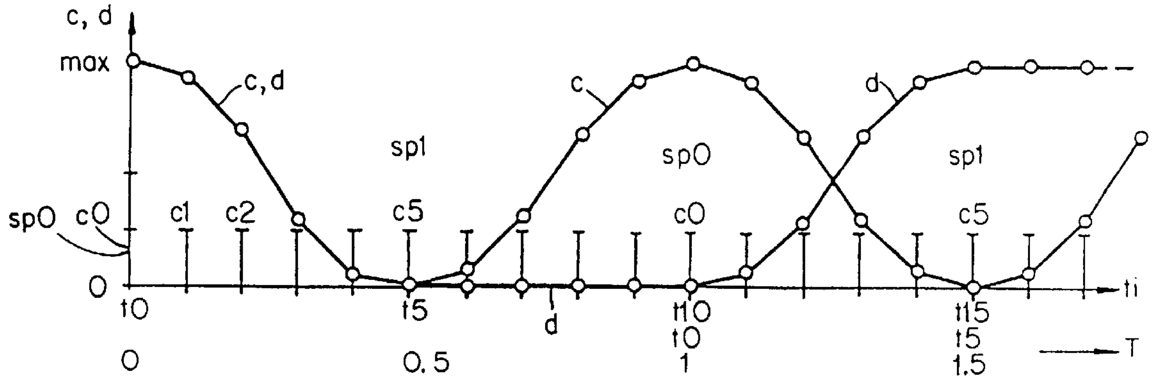
FIG. 2 is a plot of a signal with sinusoidal edges as a function of time.

FIG. 2 shows a time diagram of a clock signal c and a data signal d whose edges have been given a shape different from the exponential shape of FIG. 1 using a function generator in accordance with the invention. The edges correspond to an approximately sinusoidal characteristic. In the case of the clock signal c, a clock period T is divided into ten steps of the same length. The division is accomplished via undelayed and delayed clock signals c0 and c1 to c9, respectively, with whose time spacing the characteristic of the rising and falling edges is changed. The desired edge characteristic is formed approximately by superposition of different charging or discharge curves. The change of the charging or discharging process is controlled by the undelayed and delayed clock signals c0 and cl to c9, respectively, and by a first or second blocking signal sp0, sp1, which end the preceding charging or discharging process. In FIG. 2, the first blocking signal sp0 terminates the preceding discharging process because the negative-going edge begins at the instant t0. The preceding discharging process between instants t0 to t4 is terminated by the second blocking signal sp1 at instant t5 because the positive-going edge of the clock signal begins at this instant. The positive-going edge is ended by the first blocking signal sp0 at instants t10 and to. The finer the step width, the better the approximation to the desired signal waveform will be.

FIG. 2 also shows by way of example, the sinusoidal edge characteristic in the case of data signals d, which then remain in the logic 1 or 0 state for some time. The negative-going data edge of the example of FIG. 2 lies in the time interval t0 to t5, after which the data level remains stable until the instant t10, at which the positive-going edge begins, which ends at the instant t15. The data rate in this example is equal to the clock rate. If the data rate is less than or equal to the clock rate, either the data edges can be made less steep than the clock edges or the dwell time in the upper or lower logic state becomes correspondingly greater for an unchanged edge characteristic.

The time diagram of FIG. 2 shows the desired signal waveform on the assumption that the ideal signal values are reached at least at the values marked with small circles, and that the waveform between these values is as uniform as possible. In the case of a sinusoidal edge characteristic, this can be achieved by temporal superposition of discharging or charging curves. In the case of CMOS circuits, the capacitive load is charged by p-channel transistors and discharged by n-channel transistors that are activated by the delayed and undelayed clock signals c0 and c1 to c9, respectively. For a clock signal with sinusoidal edges whose duration is equal to half a clock period, the Table of FIG. 3 provides the associated transistor sizes, i.e., the active transistor areas. It is also assumed that the clock period T is divided into thirty time intervals that are defined by the equidistant instants t0 to t29. Via a circuit simulation program, for example, the sizes of the switching transistors, which are active at the individual instants t0 to t29, can be determined empirically in a simple manner. Since the transistor and circuit models in the simulation programs are very accurate, the results can be readily transferred to the layout.

The Table of FIG. 3 shows the result of such a simulation. The size of the necessary switching transistors is given in the time interval from t0 to t15 for the falling edge and in the time interval t15 to t30 (=t0) for the rising edge in standard values “N” and “P”, which define the size of the associated n- and p-channel transistors for achieving a sinusoidal edge characteristic. For certain time intervals, the sizes remain constant. This is also apparent from the edge characteristic of FIG. 1. At the beginning of the charging or discharge process, very small switching transistors are required since the initial voltage difference between the clock signal and capacitor voltage is large. When the charging or discharge process is nearly complete, the voltage difference is small and the steepening of the edge requires large switching transistors in this range. A very effective criterion during the simulation is the respective signal spectrum determined by computation, which can cover changes of the weighting in the fine range. Coarse changes are obtained from a simple comparison between the desired and actual voltages.

In FIG. 3, the initial sizes of the n- and p-channel transistors are shown at the instants to and t15, with “N” and “P” standing as a standard or reference value for n- and p-channel standard transistors with equal current yields. At instant t1, six of these standard transistors N are turned on. Another nine standard transistors N are turned on at instant t2, and another twelve at instant t3. At instants t4 to t7, no further transistors are turned on; this is indicated by “ON”. At instant t8, the number of n-channel transistors turned on increases by ten standard transistors N, at instant t9 by another twelve, at instant t10 by fourteen, and at instant t11 by sixteen standard transistors N. This value remains constant for instants t12 to t14. At instant t15, the end of the falling edge is reached and the rising edge begins. The end of the falling edge is forced by turning off all n-channel transistors that were activated between instants t0 and t15. The turning off is effected by the blocking signal sp1.

The positive-going edge between instants t15 and t30 is forced by turning on the p-channel transistors given in Table 3 at the respective instants. The Table relates to the standard transistors P. The positive-going edge is ended at instants t30 and to by the first blocking signal sp0, which blocks all previously activated p-channel transistors.

The simulation of the transistor sizes of FIG. 3 assumes an arbitrary load capacitance, which, as a reference capacitance for the simulation must not be changed, however. If the load capacitance is twice as large the standard transistors N, P must also be doubled; otherwise the approximation will not function. For a predetermined load capacitance the standard transistors N and P may, of course, be chosen to be greater or smaller if the preceding factor is adapted correspondingly, so that the product (e.g., 12×N) of the multiplication factor and the reference value of the standard transistor N at the respective instant ti remains constant.

Thus, an adaptation to different load capacitances for fixed standard sizes N, P can also be achieved via the respective multiplication factors, which then serve as weighting factors. In any case, direct proportionality exists between the respective weighting factor and the respective value of the capacitive load. If the capacitive loads differ by a fixed factor G, the associated weighting factors will differ by the same factor G. The proportional control of all weighting factors by a single common factor G corresponds to a multiplication of the weighting factors determined by the waveform by the factor G. This multiplication is achieved in conventional binary systems by a shift function or by a different grouping, see the embodiment of FIG. 5. The weighting in the Table of FIG. 3 is still somewhat coarse and corresponds to the desired current edges to a first degree of approximation. The Table values can be improved by the above-mentioned simulation method. During the approximation and simulation, an effort should be made to keep the number of necessary switching instants as small as possible, because otherwise the circuit complexity will increase. A solution is shown in the Table of FIG. 6.

Figure 4:
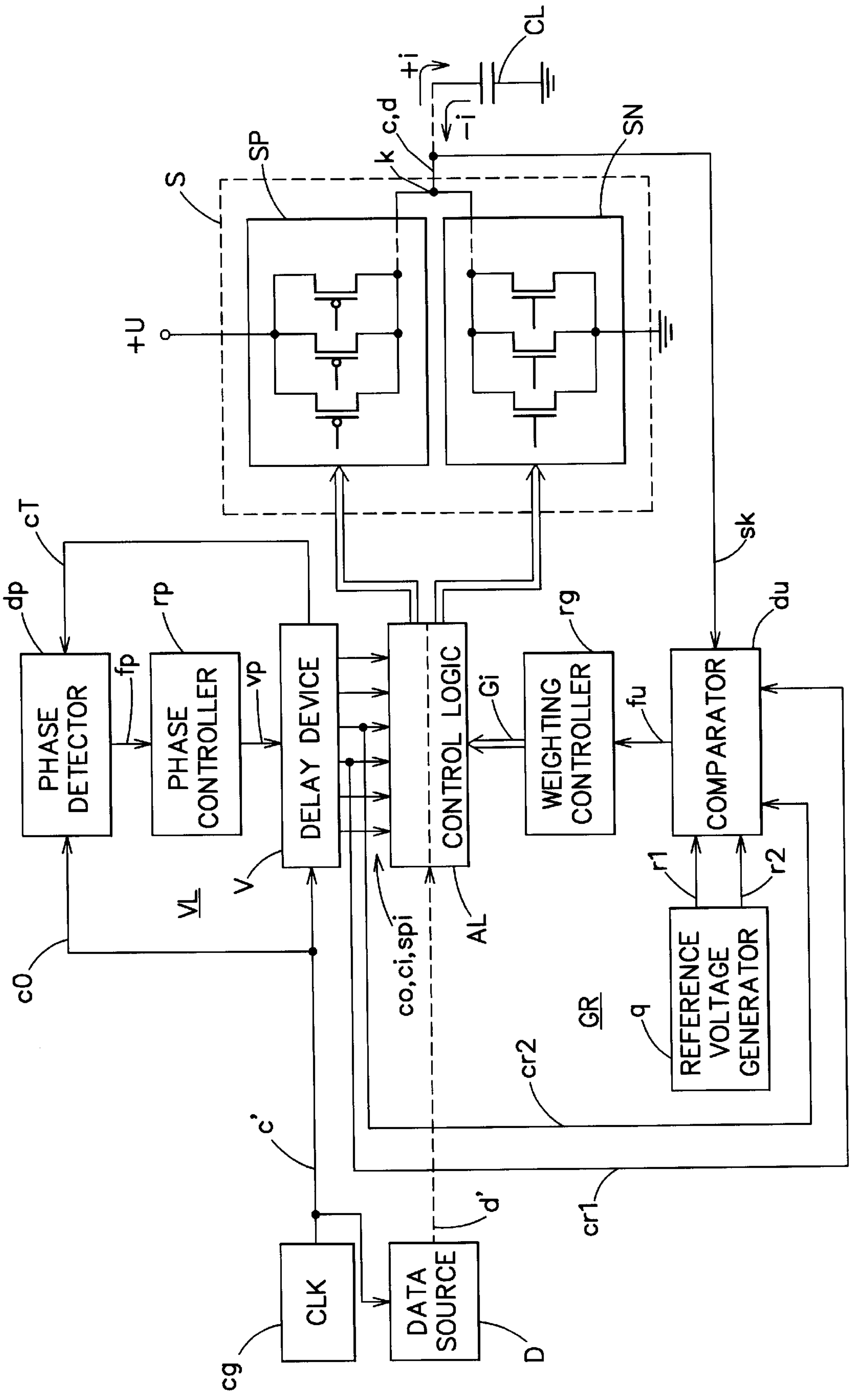
FIG. 4 is a schematic circuit diagram of a preferred embodiment of the function generator.

FIG. 4 illustrates a block diagram of an embodiment of the function generator. A delay device V generates undelayed and delayed clock signal c0 and ci, respectively, and blocking signals spi from an applied clock signal c'. These signals drive a control logic AL which provides control signals for p- and n-channel switching transistors of a switching stage S. The output currents of the individual switching transistors are summed by an output node k and serve as a charging current +i or discharge current −i for an internal or external load capacitance CL.

The clock signal c' either is locked to a system clock or comes from a clock generator cg. The clock period T is divided in the delay device V into preferably equidistant time intervals, each of which is assigned one of the delayed clock signals ci. To couple the delays exactly to the clock period T, the delays of the individual elements in the delay device V are locked to the clock period T and the reference phase of the clock signal c' by means of a delay control loop VL. If the function generator is to modify the waveform of data signals d, the control logic AL will receive (in addition to the undelayed and delayed clock signals c0 to ci and the blocking signals spi) the data signal d' from a data source D. Since the data signal d' is locked to the clock signal c', the switching edge is still controlled by the clock signal c', with the data signal d' only causing the selection of a positive- or negative-going edge or retaining the existing logic state of the output signal d.

The switching stage S contains a p-type switching stage SP in which the p-channel switching transistors are connected in parallel between the positive supply terminal +U and the output node k. Each of the switching transistors is controlled by the control logic AL via a separate control line. In a similar manner, the switching stage S contains an n-type switching stage SN in which n-channel switching transistors are connected in parallel between the output node k and ground. Each of the n-channel switching transistors is connected via a separate control line to the associated control section of the control logic AL. In the p-type switching stage SP and the n-type switching stage SN, there is one group of transistors for each switching instant ti if the size of the resulting switching transistor has to be changed at that instant. For the tabular example of FIG. 3, these are, in the case of the negative-going sinusoidal switching edge, eight transistor groups that are turned on successively at instants t0, t1, t2, t3, t8, t9, t10, and t11.

An adaptation of the current yield of the switching transistors in the switching stage S to the load capacitance CL is made possible in the embodiment of FIG. 4 by a weighting control loop GR. The weighting control loop GR is based on the assumption, for example, hat the capacitive load CL has a minimum value of 10 pF. This is referred to as a "base oad". The circuit simulation discussed above provides the sizes of the switching transistors at he respective instants ti ("base load transistors"). If a capacitive load range extending from 10 F to 100 pF is to be covered automatically by means of the weighting control loop GR, the size of the respective switching transistors must be adapted correspondingly. It fully suffices to perform the adaptation in steps rather than continuously. If fifteen adaptation steps are available for the range of 10 pF to 100 pF, the load capacitance can be adapted in 6-pF steps. This resolution is fully sufficient. The fifteen steps can be achieved, for example, by combining four weighting steps if the latter correspond to powers of two. The smallest weighting unit corresponds to a load capacitance of 6 pF, the second weighting step to a load capacitance of 12 pF, the third weighting step to a load capacitance of 24 pF, and the fourth weighting step to a load capacitance of 48 pF.

The weighting control loop GR includes a voltage comparator du which compares the voltage sk of the output node k with a reference value r1, r2 at a given instant of the edge. The reference value may be the medium step of the output signal c, d. The voltage comparison may also take place at other instants, which are defined by a first or a second comparison clock cr1, cr2, which cause corresponding reference signals r1, r2 to be transferred from a reference voltage generator q. The reference voltage generator q may be implemented with the taps of a voltage divider, for example. Whether the voltage comparison takes place on the rising or falling edge is controlled by the comparison clocks cr1, cr2. The output of the voltage comparator du is an error signal fu, which is fed to a weighting controller rg. In the simplest case, this is a 4-bit counter that is increased or decreased by one count on each pulse of the error signal fu. The 4-bit output signal of the weighting controller is the weighting value Gi, which sets the fifteen adaptation steps in the switching stage S.

The delay control loop VL compares the undelayed clock signal c0 with the clock signal cT delayed by one clock period in the delay device V (e.g., a delay chain), and forms a phase error signal fp from a phase detector dp. This phase error signal fp is fed to a phase controller rp, e.g., a PID (proportional, integral, derivative) controller and filtered to form a control signal vp, with which the delays of the delay chain are adapted.

Figure 5:
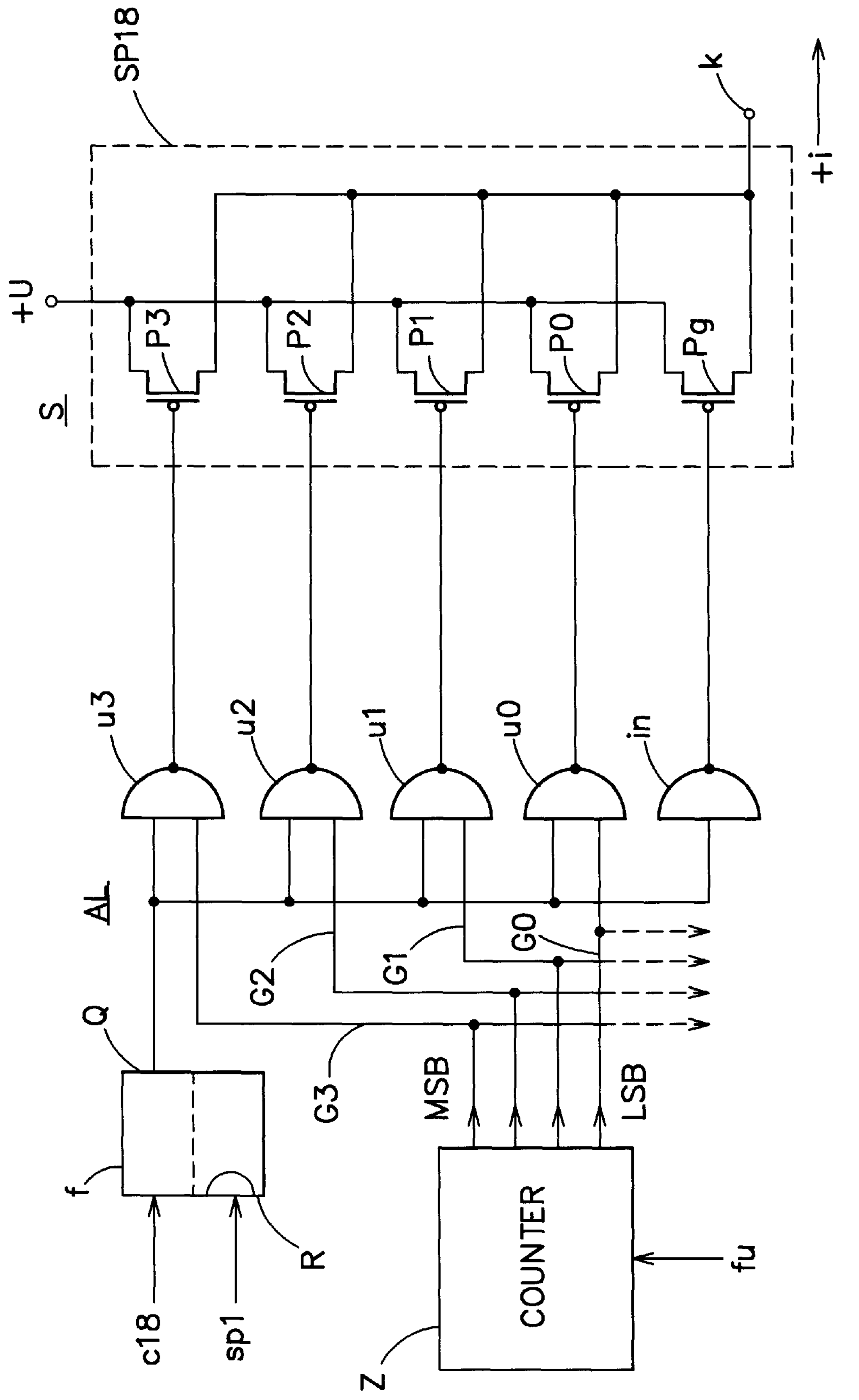
FIG. 5 is a schematic diagram of a portion of the associated control logic with the function generator illustrated in FIG. 4.

In FIG. 5, the control logic AL and the switching stage S are shown in more detail for a given instant. The switching instant corresponds to t18 of FIG. 3. Except for the weighting controller rg (e.g., a 4-bit up/down counter Z), such a stage is present for each switching instant at which the size of the switching transistors changes. The delayed clock signal c18 feeds one input of a flip-flop f, whose reset input R receives the first blocking signal sp1. The Q output of the flip-flop f is connected to one input of each of four NAND gates u0, u1, u2, u3. The other inputs of the four gates are connected to respective binary outputs of the 4-bit counter Z. The gate u3 is dependent on the MSB of the 4-bit counter. The gates u2, u1, and finally u0, which is dependent on the LSB, follow in significance. According to the bit value, the four gates u3, u2, u1, u0 drive the associated switching transistors P3, P2, P1, P0. Independently of the weighting, the flip-flop f drives the base load transistor Pg. All p-channel switching transistors are connected in parallel between the positive supply terminal +U and the output node k, so that the currents are summed in this node to form the charging current +i. The delayed clock signal c18 sets the flip-flop f, so that the Q output is at logic 1. If the corresponding bit signal from the 4-bit counter is also a logic 1, the associated NAND gate will turn the connected p-channel switching transistor on. The Q output of the flip-flop f remains in the logic 1 state until the blocking signal sp1 appears at the reset input R and resets the Q output to the logic 0 state, whereby all NAND gates u0 to u3 are inhibited and the associated switching transistors P0 to P3 are turned off. The base load transistor Pg is turned off via an inverter in, whose input is also connected to the flip-flop output Q.

FIG. 6 shows in tabular form an example of the time- and load-dependent weighting of p- and n-channel switching transistors for a sinusoidal edge characteristic, with the clock period T being divided into twenty increments of the same length. At a predetermined channel length L of 0.7 micrometers for the p- and n-channel switching transistors, the individual weighting values are set via the channel widths W. These channel widths W are given in the Table of FIG. 6 in rows Pg and Ng for a base load of 10 pF. Changes with respect to the switching transistors occur only at ten of the twenty clock instants. The corresponding instants ti are given in the two rows ti. For the p-channel switching transistors, these are the instants t0, t1, t2, t4, and t7; for the n-channel switching transistors, the instants are t10, t11, t12, t14, and t17. For an adaptation of the switching transistors to an arbitrary capacitive load between 10 pF and 100 pF, there are four weighted transistors for each clock instant ti, whose weighting factors are the powers of two $2^0$, $2^1$, $2^2$, and $2^3$, thus permitting a capacitive load step size of 6 pF. The Table of FIG. 6 shows the associated channel widths, which follow from the predetermined weighting factors G0 to G3.

Although the present invention has been shown and described with respect to several preferred embodiments thereof, various changes, omissions and additions to the form and detail thereof, may be made therein, without departing from the spirit and scope of the invention.

What is claimed is:

1. A function generator for an output signal, comprising:

a switching stage for forming a defined signal waveform, in the presence of a capacitive load, using switching transistors which are turned on by a predetermined sequence of undelayed and delayed clock signals, with an output none summing the output currents of said switching transistors; and a delay device which forms the undelayed and delayed clock signals from an applied clocksignal, with the delays of the delayed clock signal, defining predetermined instants within at least one period of the applied clock signals wherein the switching transistors are controlled by transistor control signals generated by control logic in response to (i) the undelayed and delayed clock signals and (ii) a weighting factor control signal generated by a weighting factor control circuit that compares an actual value of the output signal with a desired value of the output signal to form the weighting factor control signal.

2. A function generator for an output signal, comprising:

a switching stage for forming a defined signal waveform, in the presence of a capacitive load, using switching transistors wherein weighted in terms of their current yield, and which are turned on by a predetermined sequence of undelayed and delayed clock signals, with an output node summing the output currents of said switching transistors; and a delay device which forms the undelayed and delayed clock signals from an applied clocksignal with the delays of the delayed clock signals define predetermined instants within at least one period of the applied clock, wherein the switching transistors are controlled by transistor control signals generated by control logic in response to (i) the undelayed and delayed clock signals and (ii) a weighing factor control signal generated by a weighting factor control circuit that compares an actual value of the output signal with a desired value of the output signal to form the weighting factor control signal.

3. A function generator for an output signal (c, d), comprising:

a switching stage (S) for forming a defined signal waveform, in the presence of a capacitive load, using switching transistors which are tuned on by a predetermined sequence of undelayed (cO) and delayed clock signals (ci), with an output node (k) summing the output currents (+i, –i) of said switching transistors; and a delay device (V) which forms the undelayed (cO) and delayed clock signals (ci) from an applied clocksignal (c'), with the delays of the delayed clock signals (ci) defining predetermined instants (ti) within at least one period (T) of the applied clock signal (c'), wherein the switching transistors are turned off by means for synchronously forming blocking signals (spi) in response to at least one of the undelayed (cO) and delayed clock signals (ci).

* * * * *